United States Patent
Kojima (10) Patent No.: US 10,636,509 B2
(45) Date of Patent: Apr. 28, 2020

(54) MEMORY TEST APPARATUS

(71) Applicant: TOSHIBA MEMORY CORPORATION, Minato-ku (JP)

(72) Inventor: Tetsuharu Kojima, Kunitachi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 149 days.

(21) Appl. No.: 15/693,616

(22) Filed: Sep. 1, 2017

(65) Prior Publication Data
US 2018/0240533 A1    Aug. 23, 2018

(30) Foreign Application Priority Data
Feb. 20, 2017  (JP) .................. 2017-029111

(51) Int. Cl.
| | |
|---|---|
| G11C 29/40 | (2006.01) |
| G06F 11/263 | (2006.01) |
| G06F 11/27 | (2006.01) |
| G11C 29/56 | (2006.01) |
| G11C 29/00 | (2006.01) |

(52) U.S. Cl.
CPC .......... *G11C 29/40* (2013.01); *G06F 11/2635* (2013.01); *G06F 11/27* (2013.01); *G11C 29/006* (2013.01); *G11C 29/56008* (2013.01); *G11C 2029/5606* (2013.01)

(58) Field of Classification Search
CPC . G11C 29/40; G11C 29/006; G11C 29/56008; G11C 2029/5606; G06F 11/2635; G06F 11/27
USPC ................ 714/718, 719, 723, 201
See application file for complete search history.

(56) References Cited

U.S. PATENT DOCUMENTS

| | | | |
|---|---|---|---|
| 4,628,509 A * | 12/1986 | Kawaguchi | ............ G11C 29/72 714/711 |
| 6,269,455 B1 | 7/2001 | Deas | |
| 6,360,340 B1 | 3/2002 | Brown et al. | |
| 6,578,169 B1 * | 6/2003 | Le | .................... G01R 31/31935 714/723 |

(Continued)

FOREIGN PATENT DOCUMENTS

| | | |
|---|---|---|
| JP | 04-339399 A | 11/1992 |
| JP | 2001-504626 | 4/2001 |

(Continued)

OTHER PUBLICATIONS

Vollrath et al., Compressed Bit Fail Maps for Memory Fail Pattern Classification, 2000, IEEE, pp. 125-130. (Year: 2000).*

(Continued)

*Primary Examiner* — John J Tabone, Jr.
(74) *Attorney, Agent, or Firm* — Oblon, McClelland, Maier & Neustadt, L.L.P.

(57) ABSTRACT

A memory test apparatus according to the present embodiment comprises a first storage medium temporarily retaining a test result of memory cells of a device under test in a plurality of divided portions based on data output from the device under test. A first processor reads the divided test result from the first storage medium to compress the test result. A second storage medium is provided to respectively correspond to a plurality of the devices under test and receives the compressed test result from the first processor and saves the compressed test result.

12 Claims, 6 Drawing Sheets

(56) References Cited

U.S. PATENT DOCUMENTS

| | | | |
|---|---|---|---|
| 6,928,638 B2 * | 8/2005 | Parvathala | G06F 11/263 714/25 |
| 6,948,096 B2 * | 9/2005 | Parvathala | G01R 31/3183 714/30 |
| 7,089,135 B2 * | 8/2006 | Rajsuman | G01R 31/31813 702/117 |
| 7,529,988 B1 | 5/2009 | Sundararajan | |
| 9,342,405 B2 | 5/2016 | Burness et al. | |
| 2003/0070118 A1 * | 4/2003 | Nakao | G01R 31/31854 714/30 |
| 2003/0217345 A1 * | 11/2003 | Rajsuman | G01R 31/31813 716/102 |
| 2005/0262410 A1 * | 11/2005 | Parvathala | G06F 11/263 714/738 |
| 2007/0240022 A1 * | 10/2007 | Shinohara | G01R 31/31703 714/703 |
| 2008/0077834 A1 * | 3/2008 | Khoche | G11C 29/40 714/732 |

FOREIGN PATENT DOCUMENTS

| | | |
|---|---|---|
| JP | 2001-527261 A | 12/2001 |
| JP | 2003-098228 | 4/2003 |
| JP | 2004-117055 | 4/2004 |
| JP | 2007-157264 A | 6/2007 |
| JP | 2009-140601 | 6/2009 |

OTHER PUBLICATIONS

You et al., Deep Store: An Archival Storage System Architecture, 2005, IEEE, pp. 1-12. (Year: 2005).*

* cited by examiner

MEMORY TEST APPARATUS

CROSS REFERENCE TO RELATED APPLICATIONS

This application is based upon and claims the benefit of priority from the prior Japanese Patent Application No. 2017-029111, filed on Feb. 20, 2017, the entire contents of which are incorporated herein by reference.

FIELD

The embodiments of the present invention relate to a memory test apparatus.

BACKGROUND

A memory test apparatus has a fail memory (hereinafter, also FM) that stores therein a fail bit map obtained from a DUT (Device under test) to analyze fail bits in the DUT. The FM temporarily stores therein the fail bit map and then transfers the fail bit map to an external storage having a sufficiently large capacity for a fail bit analysis. However, a long time is required to transfer the fail bit map from the FM to the external storage. Also at the time of a defect analysis, a long time is required to transfer data between the FM and the external storage. Therefore, a fast analysis of fail bits performed inside the memory test apparatus is demanded.

To meet this demand, it is considered that a fail bit analysis is performed using the FM in the memory test apparatus. However, the FM is often constituted of a memory such as an SDRAM (Synchronous Dynamic Random Access Memory) having a high-speed interface and the capacity is smaller than that of the external storage. In this case, the FM cannot store therein the fail bit map of the whole DUT at one time if the capacity of the DUT becomes large.

It is also conceivable to increase the number of SDRAMs in the FM. In this case, however, the mounting area of the FM is enlarged.

DETAILED DESCRIPTION

A memory test apparatus according to the present embodiment comprises a first storage medium configured to temporarily retain a test result of memory cells of a device under test in a plurality of divided portions based on data output from the device under test. A first processor reads the divided test result from the first storage medium to compress the test result. A second storage medium is provided to correspond to each of a plurality of the devices under test. The second storage medium receives the compressed test result from the first processor and saves the compressed test result.

Embodiments will now be explained with reference to the accompanying drawings. The present invention is not limited to the embodiments.

Figure 1:
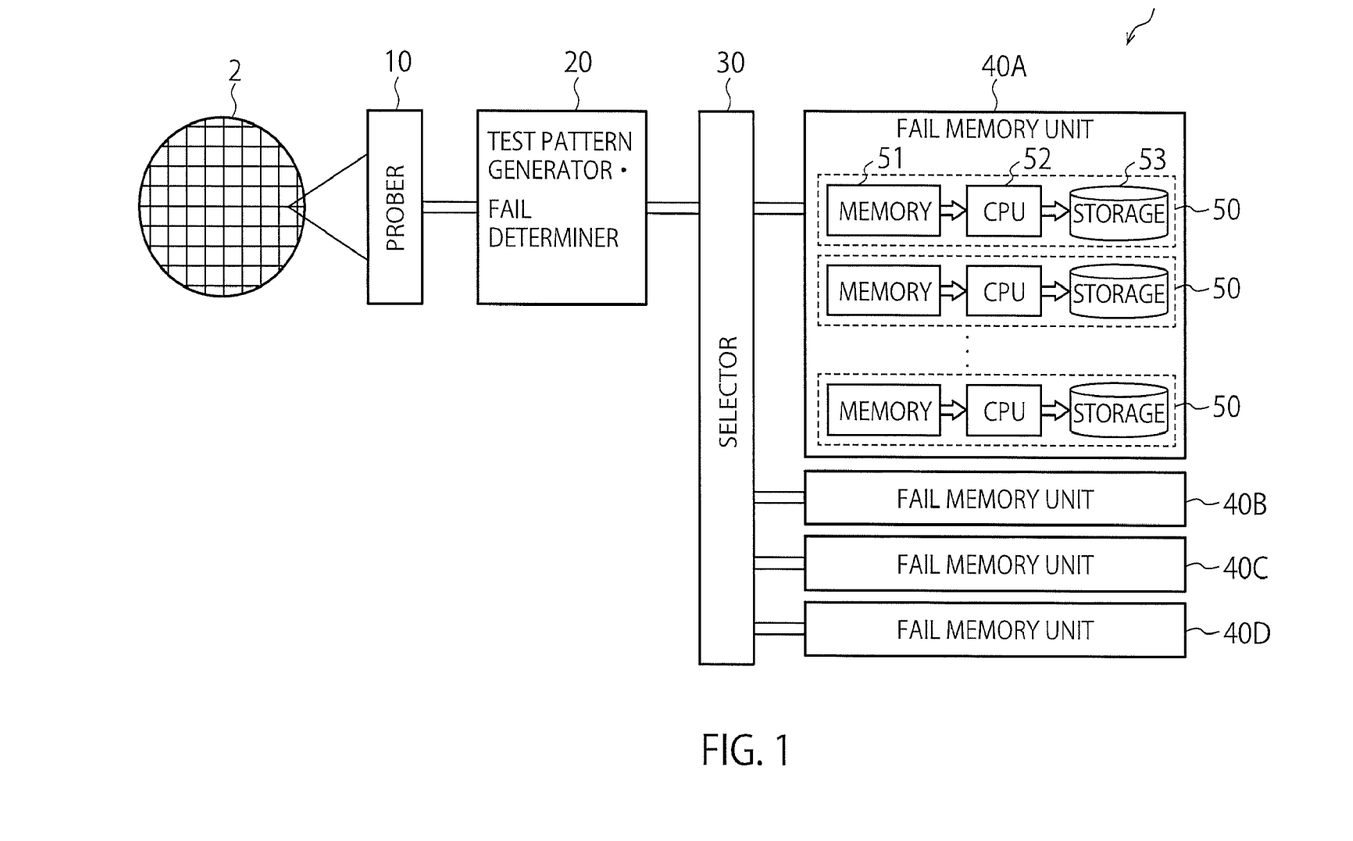
FIG. 1 is a block diagram illustrating an example of a configuration of a memory test apparatus according to the present embodiment.

FIG. 1 is a block diagram illustrating an example of a configuration of a memory test apparatus 1 according to the present embodiment. The memory test apparatus 1 inputs a test pattern to a device 2 to be tested (hereinafter, also DUT (Device under test)) and determines whether memory cells in the DUT 2 have passed or failed the test based on an output signal output from the DUT 2. Further, the memory test apparatus 1 creates a fail bit map (hereinafter, also FBM) in a plane of the DUT 2 and stores the FBM in a storage in the memory test apparatus 1. The FBM is used for purposes such as an analysis of fail bits in the DUT 2.

The DUT 2 is, for example, a semiconductor memory such as a NAND EEPROM (Electrically Erasable Programmable Read-Only Memory). The NAND EEPROM can be either a planar memory or a three-dimensional memory.

In recent years, the memory capacity of the NAND EEPROM tends to increase and the capacity of a fail memory (hereinafter, also FM) that stores therein an FBM from a DUT is demanded to increase correspondingly. The memory test apparatus 1 tests a plurality of DUTs at the same time to reduce the test time. In this case, the FM requires a capacity corresponding to the number of DUTs to be tested at one time and the capacity of the FM is further increased.

When a NAND EEPROM is to be tested, an SDRAM (Synchronous Dynamic Random Access Memory) having a faster interface than that of the NAND EEPROM is often used as the FM. This enables the FM to take in FBMs smoothly and reduce the storage time and the analysis time for FBMs. However, the SDRAM is smaller in the capacity than the NAND EEPROM. Therefore, when the DUT capacity is greatly increased, the number of SDRAMs to be used for the FM and components related thereto are also increased correspondingly. In this case, it is practically hard to provide the mounting area of the FM.

It is assumed, for example, that the FM is constituted of an SODIMM (Small Outline Dual In-Line Memory Module) of 8 gigabytes. In this case, when the memory test apparatus 1 intends to test 1024 DUTs of 1 terabit at the same time and load the entire FBM thereof into the FM, the FM needs to be constituted of 16384 SODIMMs. The mounting area of this FM is considerably large and impractical.

It is also considered that the FM is formed to have a capacity smaller than that of the DUT and that the FM takes in an output signal from the DUT in divided portions. In this case, the memory test apparatus 1 transfers the FBM temporarily taken in the FM to an external storage provided outside the memory test apparatus 1 and saves the FBM. However, a long time is required to transfer the FBM from the FM to the external storage. Furthermore, in this case, the FM cannot decompress the FBM of the whole DUT and can decompress only a portion of the FBM each time. Accordingly, a fail analysis of the whole FBM also takes a long time.

To address these problems, the memory test apparatus 1 according to the present embodiment has a storage as a part of a fail memory inside the memory test apparatus 1. The configuration of the memory test apparatus 1 is explained in more detail below.

The memory test apparatus 1 according to the present embodiment includes a prober 10, a test pattern generator/fail determiner 20, a selector 30, and fail memory units 40a to 40d as illustrated in FIG. 1.

The prober 10 has testing probes and brings the probes into contact with DUTs 2 of a semiconductor wafer placed on a stage (not illustrated), for example. The prober 10 supplies power to the DUTs 2 according to a test pattern from the test pattern generator/fail determiner 20 and transmits signals consequently output from the DUTs 2 to the test pattern generator/fail determiner 20. The prober 10 can be brought into contact with DUTs of one chip or DUTs of a plurality of chips in one touchdown. Furthermore, the prober 10 can be brought into contact with DUTs of a chip of the entire semiconductor wafer in one touchdown. A touchdown of the prober 10 is a motion of the prober 10 moving from above the DUTs 2 until the prober 10 is brought into contact with the DUTs 2.

The test pattern generator/fail determiner 20 (hereinafter, also "CPU 20") serving as a second processor inputs a preset test pattern to the DUTs 2 and determines whether respective memory cells pass or fail the test based on data output from the DUTs 2. For example, when fail or pass of memory cells is to be tested, data of the same logic ("0", for example) is written once in the DUTs 2. Next, data is read from the DUTs 2. When the data read from the DUTs 2 have changed to data of the opposite logic ("1", for example), the CPU 20 determines the relevant memory cells to be fail bits. Fail bits are memory cells that are handled as defective memory cells in the DUTs 2. The memory test apparatus 1 thus acquires FBMs (fail bit maps) in the DUTs 2. The FBMs are information indicating a test result of memory cells of the DUTs 2 and are, for example, data including fail bits and addresses indicating positions of the fail bits.

The selector 30 is provided between the test pattern generator/fail determiner 20 and the fail memory units 40a to 40d and selectively transmits the FBMs to any of the fail memory units 40a to 40d.

The fail memory units 40a to 40d each include a plurality of storage units 50 and have the same configuration. The fail memory units 40a to 40d are provided, for example, to store FBMs to correspond to touchdowns of the prober 10, respectively. That is, FBMs obtained in a first touchdown are transferred to the fail memory unit 40a, FBMs obtained in a second touchdown are transferred to the fail memory unit 40b, FBMs obtained in a third touchdown are transferred to the fail memory unit 40c, and FBMs obtained in a fourth touchdown are transferred to the fail memory unit 40d. FIG. 1 illustrates the four fail memory units 40a to 40d. However, the number of fail memory units is not limited to four.

The storage units 50 are provided, for example, to correspond to the DUTs 2, respectively. Therefore, each of the fail memory units 40a to 40d has storage units 50 as many as the DUTs 2 to be tested in one touchdown. For example, when four DUTs 2 can be tested in one touchdown, each of the fail memory units 40a to 40d has four storage units 50. When the entire semiconductor wafer can be tested in one touchdown, each of the fail memory units 40a to 40d has storage units 50 as many as the DUTs 2 included in the semiconductor wafer. However, the correspondence relation among the DUTs 2, the fail memory units 40, and the storage units 50, and the numbers thereof are not limited to those described above.

The storage units 50 are provided to correspond to the DUTs 2 as described above and each include a memory 51, a CPU 52, and a storage 53.

The memory 51 serving as a first storage medium receives an FBM from the CPU 20 via the selector 30 and temporarily retains the FBM therein. For example, an SDRAM is used as the memory 51. The memory 51 has a capacity smaller than that of the NAND EEPROM as the DUTs 2 and retains the FBM of one DUT 2 in a plurality of divided portions. This can relatively reduce the mounting area of the memory 51. The memory 51 is used also as a temporary cache memory of the CPU 52 during a fail analysis. The memory 51 has a high-speed interface and can exchange data with the CPU 52 at high speeds while the memory capacity is smaller than that of the storage 53. The memory 51 can be a volatile memory.

The CPU 52 serving as a first processor reads the divided FBM from the memory 51, compresses the FBM, and stores the compressed FBM in the storage 53. The process of storing into the storage 53 is slower than the process of loading into the memory 51 and takes a longer time. Therefore, the time required for the process of storing into the storage 53 is reduced by compressing the FBM.

The CPU 52 reads the FBM from the storage 53, decompresses the FBM on the memory 51, and performs a fail analysis of the FBM. The fail analysis will be explained later.

The storage 53 serving as a second storage medium receives the compressed FBM from the CPU 52 and stores the FBM therein. For example, a HDD (Hard Disk Drive) or an SSD (Solid State Drive) is used as the storage 53. The capacity of the storage 53 is larger than that of the DUT 2 and can store therein FBMs of many DUTs 2. The FBMs stored in the storage 53 are used for the fail analysis. While being slower in the interface than the memory 51, the storage 53 has a memory capacity larger than that of the memory 51 and can save the FBMs for a long period. It is preferable that the storage 53 is a non-volatile memory.

The memory 51, the CPU 52, and the storage 53 are provided to correspond to each of the DUTs 2. However, the memory 51 and the CPU 52 can be provided commonly for a plurality of DUTs 2. The storage 53 is provided to correspond to each of the DUTs 2 to increase the speed at which the compressed FBM is stored.

Figure 2:
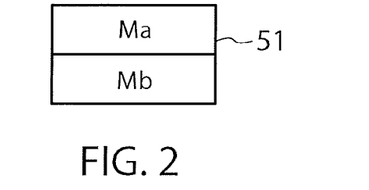
FIG. 2 is a block diagram illustrating an example of an internal configuration of one memory.

FIG. 2 is a block diagram illustrating an example of an internal configuration of one memory 51. The memory 51 is divided into two parts and includes a first memory part Ma and a second memory part Mb. The first memory part Ma and the second memory part Mb can have the same configuration.

For example, after the first memory part Ma takes in an FBM, the CPU 52 reads and compresses the FBM retained in the first memory part Ma and stores the compressed FBM in the storage 53. During that time, the first memory part Ma cannot take in a new FBM and accordingly the second memory part Mb continues to take in an FBM. While the second memory part Mb is taking in an FBM, the CPU 52 compresses the FBM retained in the first memory part Ma and stores the compressed FBM in the storage 53.

After the second memory part Mb takes in the FBM, the CPU 52 then reads and compresses the FBM retained in the second memory part Mb and stores the compressed FBM in the storage 53. Because the second memory part Mb cannot take in a new FBM during that time, the first memory part Ma continues to take in an FBM. While the first memory part Ma is continuing to take in an FBM, the CPU 52 compresses the FBM retained in the second memory part Mb and stores the compressed FBM in the storage 53. In this way, operations to take an FBM in the first memory part Ma and operations to take an FBM in the second memory part Mb are alternately (exclusively) and continuously performed. This enables the storage unit 50 to continuously and seamlessly take in an FBM of a certain DUT 2 and store the FBM in the storage 53. That is, the memory 51 can perform an interleave operation with respect to take-in of an FBM.

Furthermore, while an FBM is taken in the first memory part Ma, the CPU 52 can decompress at least a part of an FBM stored in the storage 53 on the second memory part Mb and analyze the decompressed part of the FBM. While an FBM is taken in the second memory part Mb, the CPU 52 can decompress at least a part of an FBM stored in the storage 53 on the first memory part Ma and analyze the decompressed part of the FBM. In this way, while an FBM is taken in one of the first and second memory parts Ma and Mb, the CPU 52 can use the other memory part (that is, a back side) for the analysis of fail bits. Also with this processing, the storage unit 50 can seamlessly and continuously take in an FBM of a certain DUT 2 and store the FBM therein.

The capacity of the first or second memory part Ma or Mb needs to be adjusted to match the take-in time of an FBM with the compression time of an FBM or the analysis time of fail bits. In the present embodiment, the memory 51 is divided into two parts. However, the number of divided parts of the memory 51 is not limited thereto and the memory 51 can be divided into three or more parts.

Figure 3:
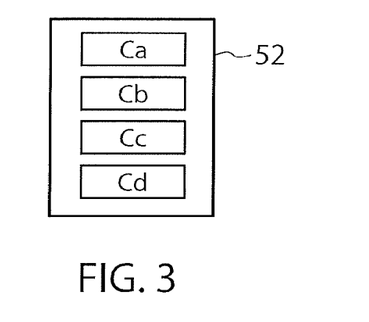
FIG. 3 is a block diagram illustrating an example of an internal configuration of one CPU.

FIG. 3 is a block diagram illustrating an example of an internal configuration of one CPU 52. The CPU 52 has a multi-core configuration and includes cores Ca to Cd. Accordingly, the compression operation of the CPU 52 can be achieved in a short time by parallelly operating a plurality of threads in the cores Ca to Cd. Data of an FBM is sequentially input to the CPU 52 and is continuously compressed by an available one of the cores Ca to Cd. Each of the cores Ca to Cd can be adapted to parallelly process a plurality of threads at the same time.

The cores Ca to Cd have the same processing capacity (processing speed). However, times required for the compression process of an FBM vary according to count values of fail bits or fail patterns. Therefore, even if the cores Ca to Cd start the compression processes at the same time, the compression processes do not always end at the same time. Accordingly, the data of an FBM is compressed by one of the cores Ca to Cd, which is available when the data is transferred from the memory 51. This enables the compression operation of the CPU 52 to compress FBMs continuously and in a short time.

The memory test apparatus 1 according to the present embodiment interiorly has the CPUs 52 that process FBMs and the storages 53 that store FBMs therein as well as the memories 51. Accordingly, the need to access an external storage for the storage of FBMs and the fail analysis using the FBMs is eliminated. Furthermore, the storage units 50 are provided for the DUTs 2, respectively, and can store FBMs of the corresponding DUTs 2 in the storages 53, respectively. Therefore, the storage units 50 can perform the take-in processes, the compression processes, and the storage processes of FBMs of the DUTs 2 simultaneously and parallelly. As a result, the entire operation of the fail memory units 40a to 40d is also speeded up. Furthermore, because the storages 53 store therein the FBMs of the corresponding DUTs 2, respectively, the fail analyses of the respective DUTs 2 are facilitated.

An operation of the memory test apparatus 1 according to the present embodiment is explained next.

Figure 4:
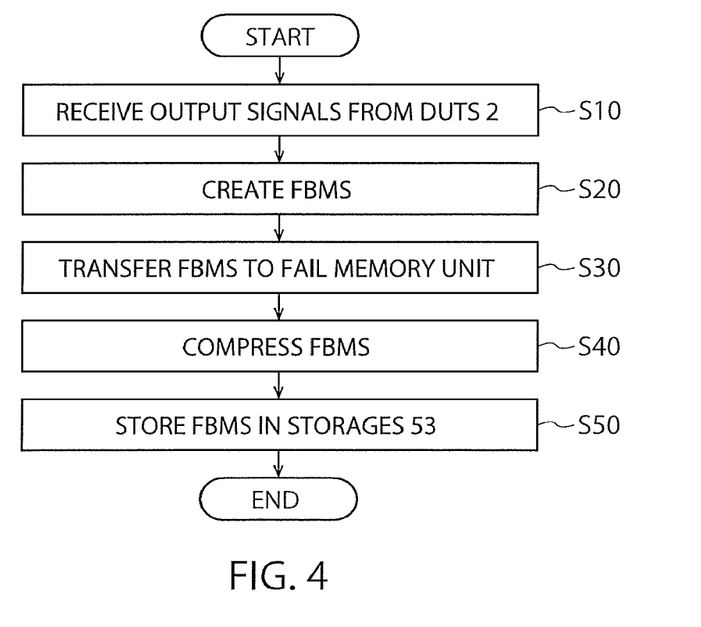
FIG. 4 is a flowchart illustrating an FBM storage operation of the memory test apparatus according to the present embodiment.
Figure 5:
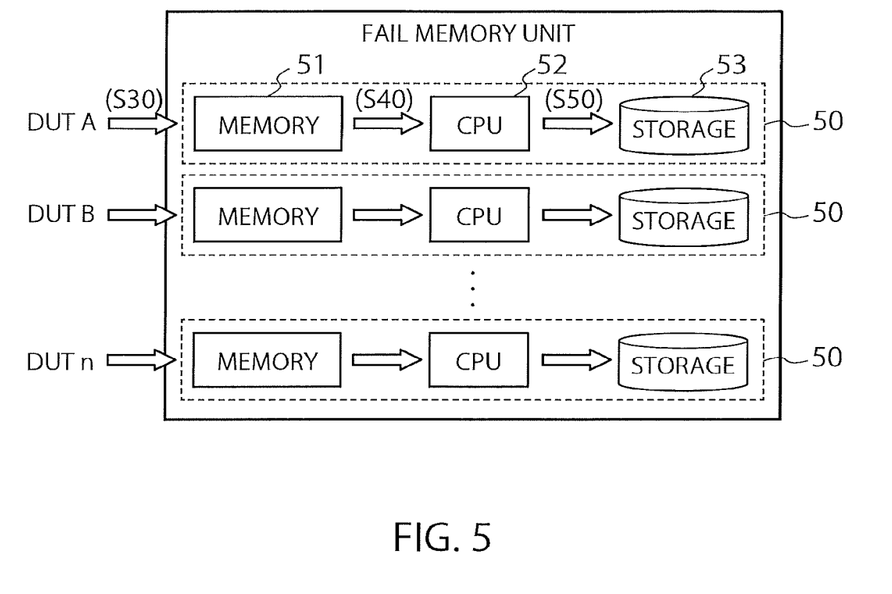
FIG. 5 is a conceptual diagram illustrating the FBM storage operation.

FIG. 4 is a flowchart illustrating an FBM storage operation of the memory test apparatus 1 according to the present embodiment. FIG. 5 is a conceptual diagram illustrating the FBM storage operation.

First, the prober 10 touches down on a semiconductor wafer to bring the probes into contact with DUTs 2. Next, the CPU 20 supplies power according to a test pattern to the DUTs 2 via the prober 10 and receives output signals with respect to the test pattern from the DUTs 2 (Step S10).

Subsequently, the CPU 20 compares the output signals with an expected value to determine whether the output signals have logical values equal to the expected value and creates an FBM (Step S20). The CPU 20 determines a bit (a memory cell) to pass when the output signal has a logical value equal to the expected value, and the CPU 20 determines a bit to fail when the output signal has a logical value different from the expected value. The FBM serving as a test result that contains fail bits and addresses thereof is transferred to any of the fail memory units 40a to 40d via the selector 30 while being divided (Step S30). For example, when the selector 30 selects the fail memory unit 40a and transfers the FBM to the fail memory unit 40a, the fail memory unit 40a temporarily retains the divided FBMs in the memories 51. At that time, the memories 51 of the respective storage units 50 take in the FBMs of the corresponding DUTs 2, respectively, as illustrated in FIG. 5.

Next, the CPUs 52 read the FBMs stored in the corresponding memories 51 and perform the compression process of the FBMs (Step S40). At that time, the CPUs 52 of the respective storage units 50 compress the FBMs of the corresponding DUTs 2, respectively, as illustrated in FIG. 5. Thereafter, the CPUs 52 store the compressed FBMs in the corresponding storages 53 (Step S50). At that time, as illustrated in FIG. 5, the CPUs 52 of the respective storage units 50 store the FBMs of the corresponding DUTs 2 in the storages 53, respectively.

As explained with reference to FIGS. 2 and 3, the CPU 52 can take in an FBM continuously and seamlessly using the first and second memory parts Ma and Mb of the corresponding memory 51. This enables the take-in process of an FBM to be performed smoothly without the rate being limited by the internal processing of the memory test apparatus 1.

A fail analysis of an FBM is explained next.

Figure 6:
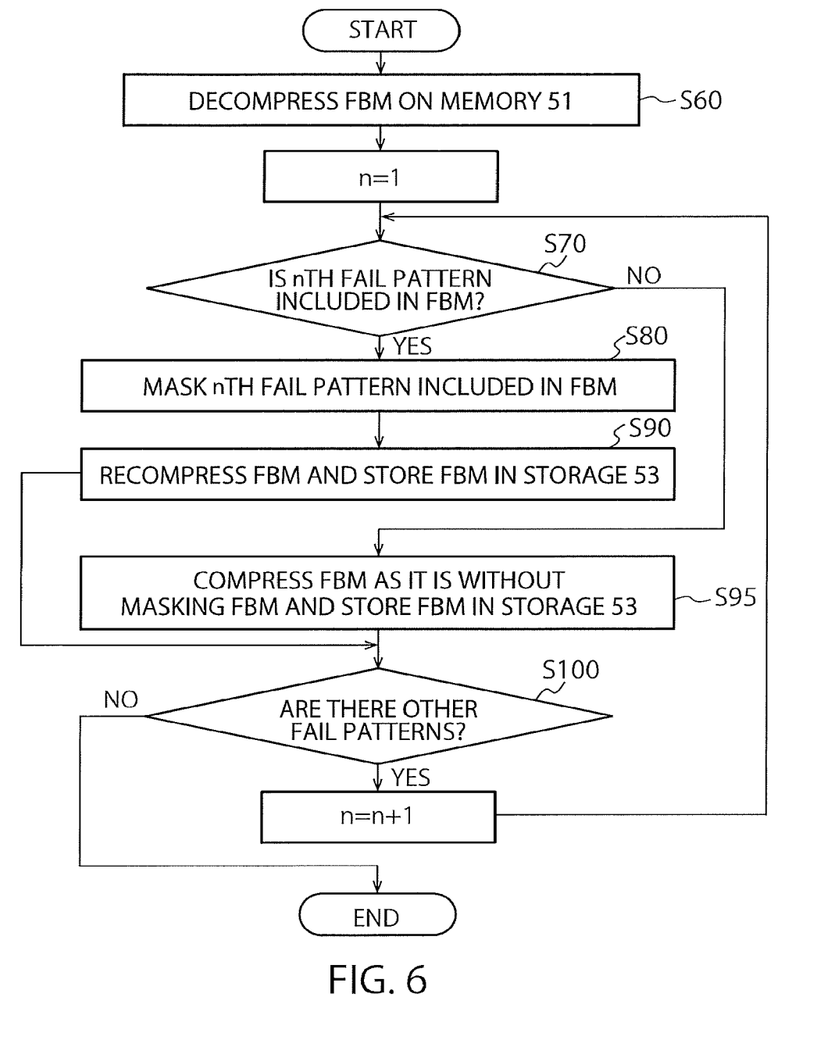
FIG. 6 is a flowchart illustrating an example of the fail analysis.
Figure 7:
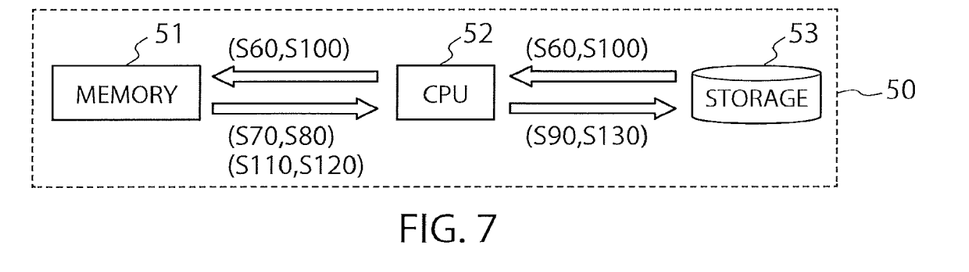
FIG. 7 is a conceptual diagram illustrating an example of the fail analysis.

FIG. 6 is a flowchart illustrating an example of the fail analysis. FIG. 7 is a conceptual diagram illustrating an example of the fail analysis. When the CPU 52 performs the fail analysis, the CPU 52 performs the fail analysis using an FBM stored in the corresponding storage 53.

First, the CPU 52 reads an FBM required for the analysis from the storage 53, extracts the FBM, and writes the extracted FBM in the memory 51 to be decompressed thereon (Step S60).

Next, the CPU 52 compares the FBM decompressed on the memory 51 with a preset nth (n is a positive integer) fail pattern. Initially, n=1 is established. Therefore, the CPU 52 compares the FBM decompressed on the memory 51 with a preset first fail pattern (Step S70).

A fail pattern is a physical shape pattern of fail bits indicating the positions, arrangement, or design of fail bits in the plane of a semiconductor wafer. Because fail patterns and defect factors are associated with each other, defect factors can be identified to some extent by fail patterns. These fail patterns are previously stored along with the defect factors as a database in an external or internal storage of the memory test apparatus 1. Many fail patterns are prepared in advance and accordingly the memory test apparatus 1 can automatically draw various defect factors.

The comparison between a fail pattern and an FBM is performed, for example, using the number of fail bits included in a certain unit such as a memory block, a page, or a column in the DUT 2. For example, the CPU 52 counts fail bits included in a certain analysis target page in the DUT 2. Next, the CPU 52 compares the number of fail bits in the analysis target page with a threshold of a fail pattern related to the page, which is previously stored in the database. When the number of fail bits in the analysis target page exceeds the threshold, the CPU 52 determines that the analysis target page includes a defect factor. Similarly, the CPU 52 also counts fail bits in units such as a memory block and a column and compares the number of fail bits with a threshold of a fail pattern related to the units such as the memory block and the column. This enables the CPU 52 to determine a defect factor in the units such as the memory block and the column. The fail analysis can be performed for a two-dimensional area such as a memory block or can be performed for a one-dimensional line such as a page or a column. Furthermore, the fail analysis can be performed for a specific memory cell in a pinpoint manner.

When the number of fail bits in the FBM exceeds the threshold of the first fail pattern, the CPU 52 determines that the FBM includes the first fail pattern (YES at Step S70). In this case, the CPU 52 masks the first fail pattern in the FBM (Step S80). The CPU 52 masks the first fail pattern and accordingly the first fail pattern in the FBM is released from a fail state on the FBM. That is, the first fail pattern in the FBM is changed from the fail state to a pass state in the FBM.

Next, the CPU 52 recompresses the masked FBM and stores the recompressed FBM in the storage 53 (Step S90). Along therewith, the CPU 52 compresses also fail information such as the addresses of fail bits corresponding to the first fail pattern and stores the compressed fail information in the storage 53.

When the number of fail bits in the FBM is smaller than the threshold of the first fail pattern, the CPU 52 determines that the first fail pattern is not included in the FBM (NO at Step S70). In this case, the CPU 52 does not mask the FBM and compresses the FBM as it is to be stored in the storage 53 (Step S95).

When there are other fail patterns (YES at Step S100), the CPU 52 increments n by 1 and repeats the processes at Step S70 to S95. In this way, the CPU 52 performs the fail analysis also for other fail patterns (second, third . . . fail patterns) in the same manner. This classifies the types of fails in the FBM according to the fail patterns.

For example, when n=2 is established, the CPU 52 reads an FBM required for the analysis from the storage 53, extracts the FBM, writes the extracted FBM in the memory 51, and decompresses the FBM. At that time, the FBM to be extracted is an FBM after first classification, from which the first fail pattern has been eliminated.

Next, the CPU 52 compares the FBM decompressed on the memory 51 with a preset second fail pattern (Step S70). The second fail pattern is a fail pattern of a type different from the first fail pattern.

When the number of fail bits in the FBM exceeds a threshold of the second fail pattern, the CPU 52 determines that the second fail pattern is included in the FBM (YES at Step S70). In this case, the CPU 52 masks the second fail pattern in the FBM (Step S80). By masking the second fail pattern, the second fail pattern in the FBM is released from a fail state in the FBM.

Subsequently, the CPU 52 recompresses the masked FBM and stores the recompressed FBM in the storage 53 (Step S90). Along therewith, the CPU 52 compresses the addresses of fail bits corresponding to the second fail pattern and stores the addresses in the storage 53. That is, an FBM after second classification, from which the second fail pattern has been eliminated, is stored in the storage 53.

When the number of fail bits in the FBM is smaller than the threshold of the second fail pattern, the CPU 52 determines that the second fail pattern is not included in the FBM (NO at Step S70). In this case, the CPU 52 does not mask the FBM and compresses the FBM as it is to be stored in the storage 53 (Step S95).

When analyses of all fail patterns are performed (NO at Step S100), the fail analysis ends.

As described above, the memory test apparatus 1 according to the present embodiment can perform also the fail analysis of FBMs, as well as storage of FBMs, in the fail memory units 40a to 40d. That is, according to the present embodiment, the fail analysis can be performed inside the memory test apparatus 1 without the need to perform the fail analysis in an external server.

The fail analysis can be performed when an FBM from the DUT 2 is loaded into one of the first and second memory parts Ma and Mb in FIG. 2 and by using the other of the first and second memory parts Ma and Mb. That is, the CPU 52 can perform the fail analysis in either the first or second memory part Ma or Mb on the back side. Accordingly, the storage unit 50 can take in an FBM of a certain DUT 2 seamlessly and continuously and can reduce the time of the fail analysis.

Furthermore, while an FBM is loaded into one of the first and second memory parts Ma and Mb, the CPU 52 can read an FBM retained in the other of the first and second memory parts Ma and Mb, compress the read FBM, and store the compressed FBM in the storage 53. In this case, it suffices that the CPU 52 performs the compression process and the storage process of an FBM in priority to the fail analysis, and performs the fail analysis after the compression process and the storage process of the FBM are completed.

Alternatively, the memory 51 can be divided into three parts as described above. In this case, while an FBM is loaded into a first memory part among the three memory parts, the CPU 52 can perform the compression process and the storage process of an FBM in a second memory part, and perform the fail analysis in a third memory part. Also by this processing, the storage unit 50 can take in an FBM of the DUT 2 seamlessly and continuously and can reduce the time of the fail analysis.

According to the present embodiment, the storage units 50 in the memory test apparatus 1 are provided for respective DUTs 2 and store FBMs of the corresponding DUTs 2 in the storage units 53, respectively. This enables the memory test apparatus 1 to store therein FBMs of a large-capacity memory device such as an NAND EEPROM. The memory 51 divides an FBM and takes in the divided FBMs, and the CPU 52 compresses the divided FBMs and stores the FBMs in the storage 53. Therefore, the memory 51 does not need to be configured to have a large capacity as the NAND EEPROM and the memory 51 can be adequately constituted of an SDRAM having a small capacity while being fast. Accordingly, the mounting area of the memory 51 is relatively reduced. Furthermore, because the CPU 52 enables transmission and reception of an FBM between the memory 51 and the storage 53, the CPU 52 can complete the storage of an FBM and the fail analysis in the inner part of the memory test apparatus 1. The fail patterns to be used for the fail analysis are sometimes loaded from an external database.

The memory 51 is divided into a plurality of memory parts. Accordingly, the memory 51 can perform an interleave operation with respect to loading of an FBM. The CPU 52 has a plurality of cores or can process a plurality of threads at the same time. Therefore, the compression or storage process and the fail analysis of the CPU 52 can be performed parallelly at the same time, resulting in a reduction of the processing time.

(First Modification)

In the embodiment described above, the CPU 52 decompresses an FBM stored in the storage 53, then counts fail bits to determine a fail pattern, and performs the masking process and the recompression process. That is, counting of fail bits is performed after decompression of an FBM.

In contrast thereto, the CPU 52 according to a first modification previously counts fail bits after an FBM is created at Step S20 in FIG. 4 and before the FBM is stored in the storage 53 at Step S50. That is, at the time of taking in an FBM and compressing the FBM, the CPU 52 also performs counting of fail bits. The CPU 52 then previously stores the count value along with the FBM in the storage 53.

At the time of the fail analysis, the CPU 52 reads the count value from the storage 53, determines a fail pattern, and creates mask information before decompressing an FBM. Thereafter, at the time of decompressing an FBM from the storage 53, the CPU 52 decompresses the masked FBM on the memory 51. At the time of recompressing the FBM, the CPU 52 performs counting of fail bits in the masked FBM and stores the count value along with the FBM in the storage 53.

Configurations of the memory test apparatus 1 according to the first modification can be identical to those in the embodiment described above.

Figure 8A:
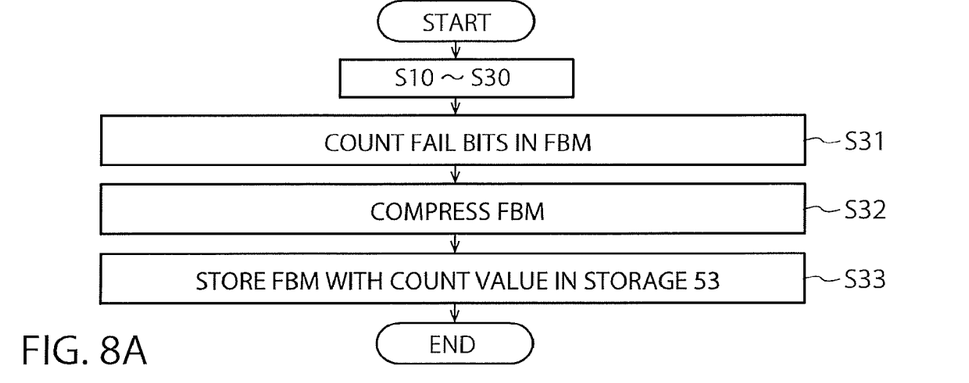
FIGS. 8A and 8B are flowcharts illustrating an example of an operation of the memory test apparatus according to the first modification.
Figure 8B:
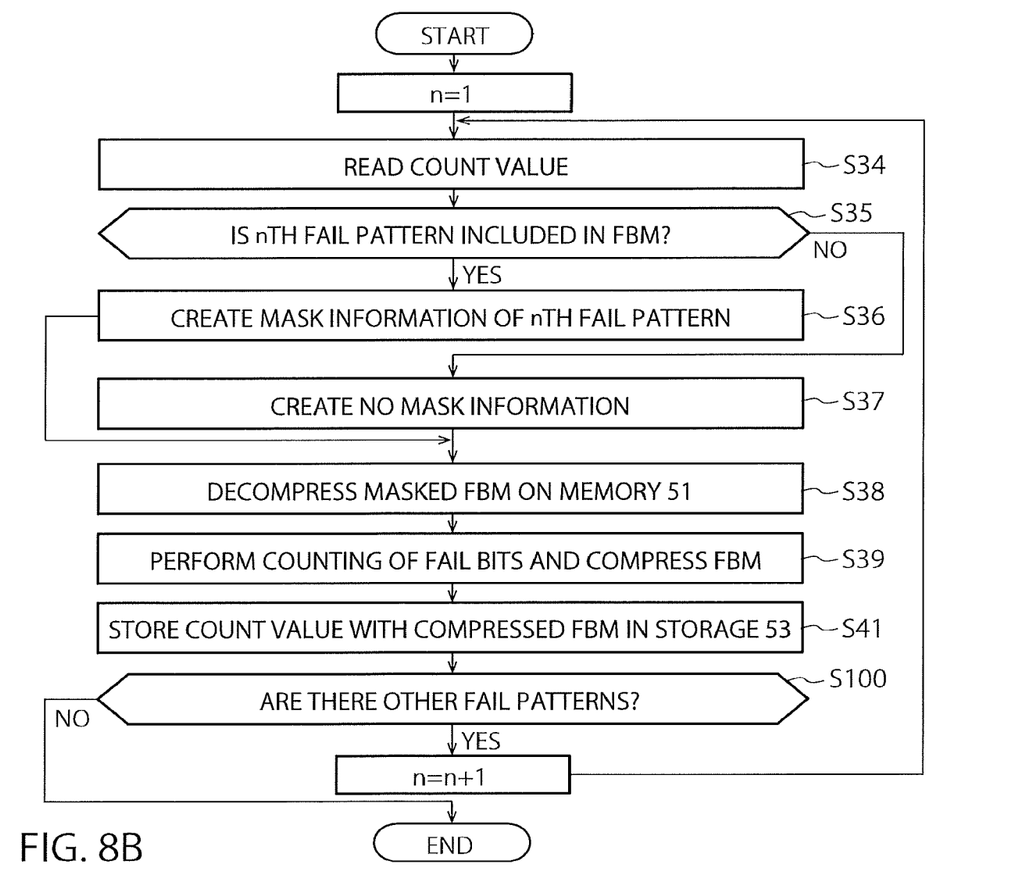

FIGS. 8A and 8B are flowcharts illustrating an example of an operation of the memory test apparatus 1 according to the first modification. FIG. 8A illustrates an FBM storage operation and FIG. 8B illustrates a fail analysis.

First, after performing the processes at Steps S10 to S30 in FIG. 4, the CPU 52 counts fail bits in an FBM as illustrated in FIG. 8A (Step S31).

Next, the CPU 52 compresses the FBM (Step S32).

Subsequently, the CPU 52 stores the compressed FBM along with the count value in the storage 53 (Step S33).

At the time of the fail analysis, as illustrated in FIG. 8B, the CPU 52 reads the count value from the storage 53 (Step S34) and determines whether the first fail pattern is included (Step S35) before decompressing an FBM. At that time, the CPU 52 compares the FBM with the first fail pattern. The comparison operation can be identical to the comparison operation explained with reference to Step S70 in FIG. 6.

When the number of fail bits in the FBM exceeds the threshold of the first fail pattern, the CPU 52 determines that the first fail pattern is included in the FBM (YES at Step S35). In this case, the CPU 52 creates mask information to mask the first fail pattern (Step S36).

When the number of fail bits in the FBM is smaller than the threshold of the first fail pattern, the CPU 52 determines that the first fail pattern is not included in the FBM (NO at Step S35). In this case, the CPU 52 creates no mask information (Step S37).

Next, the CPU 52 reads the FBM from the storage 53, performs the masking process, and then decompresses the masked FBM on the memory 51 (Step S38). In this way, the masked FBM is decompressed on the memory 51. When no mask information is created (Step S37), the masked FBM is the same as the FBM having been stored in the storage 53.

Subsequently, the CPU 52 performs counting of fail bits in the masked FBM and recompresses the FBM (Step S39).

Next, the CPU 52 stores the count value along with the compressed FBM in the storage 53 (Step S41).

When there are other fail patterns (YES at Step S100), the CPU 52 increments n by 1 and repeats the processes at Step S34 to S100. Accordingly, the CPU 52 similarly performs the fail analysis also for other fail patterns (second, third . . . fail patterns). This classifies the types of fails in the FBM according to the fail patterns.

Other operations of the first modification can be identical to those in the embodiment described above.

According to the first modification, when an FBM is compressed and stored in the storage 53, the CPU 52 counts fail bits. Therefore, it suffices that the CPU 52 reads the FBM from the storage 53 after reading the count value, determining a fail pattern, and creating mask information. In this case, the CPU 52 can decompress the FBM on the memory 51 after performing the masking process. Accordingly, the time to decompress the FBM on the memory 51 and perform the masking process is reduced.

(Second Modification)

In a second modification, the selector 30 appropriately switches among fail memory units to which FBMs are transferred, and accordingly non-selected fail memory units perform the fail analysis independently in an offline state. Configurations of the memory test apparatus 1 according to the second modification can be identical to those in the embodiment described above.

For example, the selector 30 selectively transfers an FBM to any of the fail memory units 40a to 40d. First, the selector 30 selects the first fail memory unit 40a among the fail memory units 40a to 40d to store an FBM in the first fail memory unit 40a. When the first fail memory unit 40a is thereafter performing the fail analysis of the FBM, the selector 30 selects the second fail memory unit 40b to transfer another FBM to the second fail memory unit 40b.

After the FBM is stored in the second fail memory unit 40b and when the second fail memory unit 40b is performing the fail analysis of the FBM, the selector 30 selects the third fail memory unit 40c to transfer still another FBM to the third fail memory unit 40c.

When the fail analysis in the first fail memory unit 40a thereafter ends, the selector 30 can select the first fail memory unit 40a again and transfer an FBM to the first fail memory unit 40a again. Other operations of the second modification can be identical to those in the embodiment described above.

As described above, a fail memory unit selected by the selector 30 takes in an FBM while unselected fail memory units can perform the fail analysis independently in an offline state. This enables the fail memory units 40a to 40d to parallelly perform the take-in process of an FBM and the fail analysis.

(Third Modification)

In the embodiment described above, the fail memory units store therein different FBMs, respectively. In contrast thereto, in a third modification, the fail memory units store therein the same FBM and perform the fail analysis of the FBM with respect to different fail patterns, respectively. In this case, the selector 30 functions as a divider. Configurations of the memory test apparatus 1 according to the third modification can be identical to those in the embodiment described above.

For example, the selector 30 transfers the same FBM to the first and second fail memory units 40a and 40b. In the first fail memory unit 40a, the CPU 52 compares the FBM with the first fail pattern and performs the fail analysis on the FBM with respect to the first fail pattern. When the first fail pattern is included in the FBM, the CPU 52 masks the first fail pattern in the FBM and stores the masked FBM in the storage 53. Along therewith, the CPU 52 stores fail information including the addresses of fail bits corresponding to the first fail pattern in the storage 53.

In the second fail memory unit 40b, the CPU 52 compares the FBM with the second fail pattern and performs the fail analysis on the FBM with respect to the second fail pattern. When the second fail pattern is included in the FBM, the CPU 52 masks the second fail pattern in the FBM and stores the masked FBM in the storage 53. Along therewith, the CPU 52 stores fail information including the addresses of fail bits corresponding to the second fail pattern in the storage 53.

Of course, the remaining fail memory units 40c and 40d also can store the same FBM as the FBM described above and perform the fail analysis on the FBM with respect to different fail patterns (third and fourth fail patterns, for example), respectively.

In this manner, by performing distributed processing of the fail analysis on the same FBM using a plurality of fail memory units, the time of the fail analysis is reduced.

(Fourth Modification)

Figure 9:
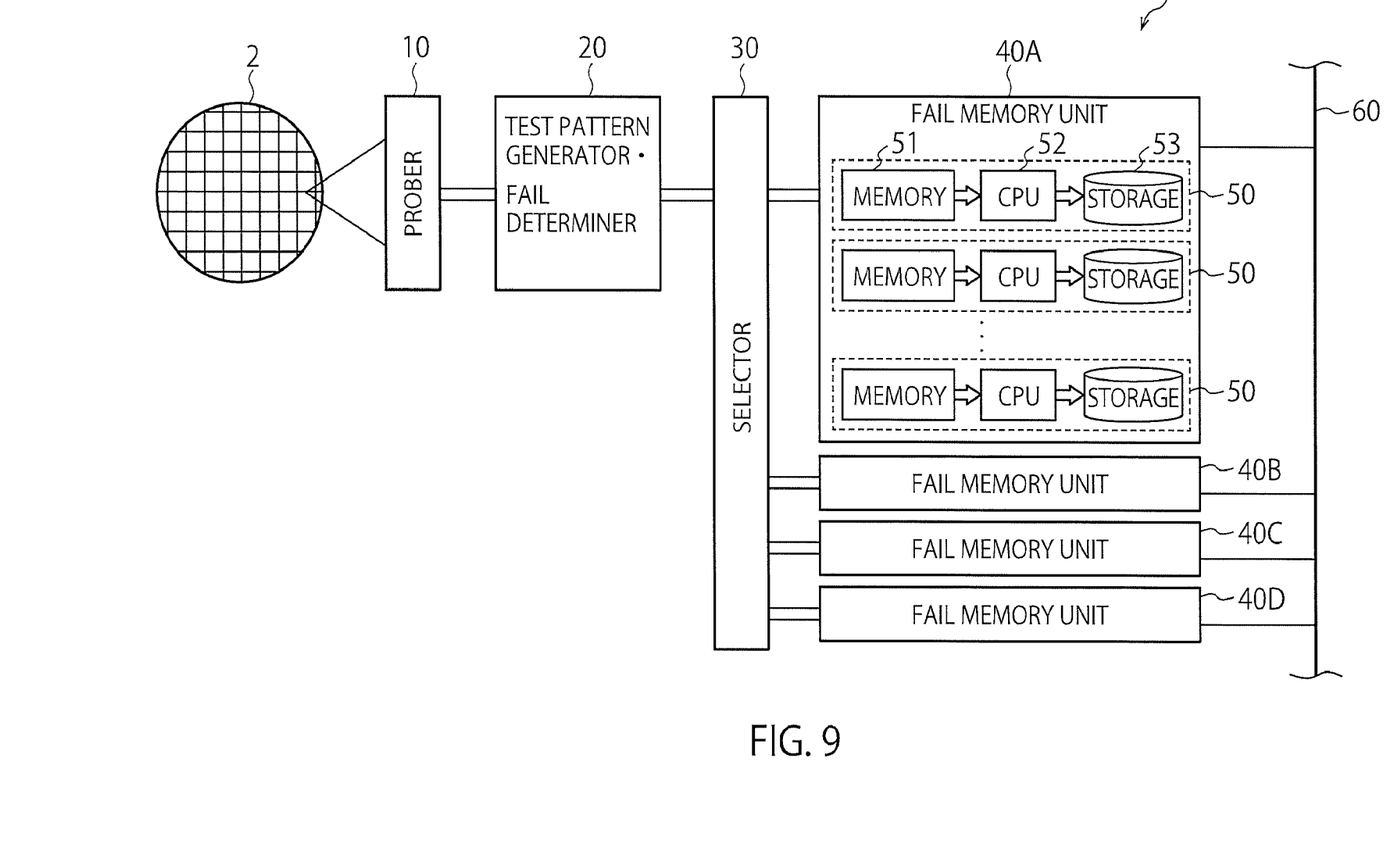
FIG. 9 is a block diagram illustrating an example of a configuration of the memory test apparatus according to a fourth modification.

FIG. 9 is a block diagram illustrating an example of a configuration of the memory test apparatus 1 according to a fourth modification. The memory test apparatus 1 according to the fourth modification further includes a data bus 60 that connects the fail memory units 40a to 40d with each other. Other configurations of the memory test apparatus 1 according to the fourth modification can be identical to corresponding ones in the embodiment described above.

The data bus 60 can transfer an FBM between the fail memory units 40a to 40d. For example, the data bus 60 can transfer an FBM stored in the first fail memory unit 40a to the second fail memory unit 40b.

After the first fail memory unit 40a takes in an FBM, the FBM can be transferred to the second fail memory unit 40b via the data bus 60. This enables the first fail memory unit 40a to continuously take in (rewrite) an FBM. The FBM taken next in the first fail memory unit 40a is transferred to the third fail memory unit 40c via the data bus 60. This enables the first fail memory unit 40a to further continuously take in an FBM. The FBM subsequently taken in the first fail memory unit 40a is transferred to the fourth fail memory unit 40d via the data bus 60.

By transferring FBMs via the data bus 60 in this manner, the same first fail memory unit 40a can continuously take in FBMs. In this case, it suffices that the selector 30 keeps selecting the first fail memory unit 40a.

In the embodiment and modifications described above, the memory test apparatus 1 stores FBMs therein. However, the memory test apparatus 1 can store therein test results of other electrical characteristics of the memory cells. Furthermore, in the embodiment described above, the memory test apparatus 1 can perform the storage process of an FBM and the fail analysis in parallel. Therefore, when a user desires to perform a retest referring to the result of the fail analysis, a semiconductor wafer is still placed on the stage in some cases. In such cases, the memory test apparatus 1 can promptly perform reacquisition of an FBM or retest of the electrical characteristics.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A memory test apparatus comprising:
a first storage medium comprising a first memory part and a second memory part which receive and temporarily retain first and second divided test results respectively, the first and second divided test results being divided portions of a test result of memory cells of a device under test based on data output from the device under test;
a first processor reading the first and second divided test results from the first and second memory parts and to compress the first and second divided test results into first and second compressed test results; and
a second storage medium provided to the device under test, the second storage medium receiving the first and second compressed test results from the first processor and saving the first and second compressed test results,
wherein the second storage medium, the first storage medium, and the first processor are provided to respectively correspond to a plurality of devices under test,
while the first divided test result is compressed by the first processor and stored into the first storage medium, the first processor analyzes the second divided test result stored in the first storage medium using the second memory part, and
while the second divided test result is compressed by the first processor and stored into the second storage medium, the first processor analyzes the first divided test result stored in the first storage medium using the first memory part,
wherein in the analysis of the first divided test result, the first processor reads the first or second compressed test results from the second storage medium, decompresses the read first or second compressed test results into a decompressed test result stored on the first storage medium, and compares the decompressed test result with a preset first fail pattern, and stores addresses of first fail bits corresponding to the preset first fail pattern included in the decompressed test result in the second storage medium when the preset first fail pattern is included in the decompressed test result.

2. The apparatus of claim 1, further comprising:
a plurality of fail memory units respectively comprising the first storage medium, the first processor, and the second storage medium, and
a selector provided between the devices under test and the fail memory units receiving the first and second divided test results and transferring the first or second divided test results selectively to any of the fail memory units of the plurality of fail memory units.

3. The apparatus of claim 2, wherein the selector transfers the first divided test result to a second fail memory unit of the plurality of fail memory units while the second divided test result stored in a first fail memory unit of the plurality of fail memory units is analyzed.

4. The apparatus of claim 2, further comprising a data bus connecting the fail memory units to each other, wherein
the first or second divided test result stored in a first fail memory unit of the plurality of fail memory units can be transferred to a second fail memory unit of the plurality of fail memory units.

5. A memory test apparatus comprising:
a first storage medium comprising a first memory part and a second memory part which receive and temporarily retain first and second divided test results respectively, the first and second divided test results being divided portions of a test result of memory cells of a device under test based on data output from the device under test;
a first processor reading the first and second divided test results from the first and second memory parts and to compress the first and second divided test results into first and second compressed test results; and
a second storage medium provided to the device under test, the second storage medium receiving the first and second compressed test results from the first processor and saving the first and second compressed test results;
wherein the second storage medium, the first storage medium, and the first processor are provided to respectively correspond to a plurality of devices under test,
while the first divided test result is loaded into the first memory part, the first processor compresses the second divided test result from the second memory part into the second compressed test result and stores the second compressed test result in the second storage medium, and
while the second divided test result is loaded into the second memory part, the first processor compresses the first divided test result from the first memory part into the first compressed test result and stores the first compressed test result in the second storage medium,
in an analysis of the divided test results, the first processor reads the first or second compressed test results from the second storage medium, decompresses the read first or second compressed test results into a decompressed test result on the first storage medium, and compares the decompressed test result with a preset first fail pattern, and stores addresses of first fail bits corresponding to the preset first fail pattern included in the decompressed test result in the second storage medium when the preset first fail pattern is included in the decompressed test result.

6. The apparatus of claim 5, further comprising:
a plurality of fail memory units respectively comprising the first storage medium, the first processor, and the second storage medium, and
a selector provided between the devices under test and the fail memory units receiving the first and second divided test results and transferring the first or second divided test results selectively to any of the fail memory units of the plurality of fail memory units.

7. The apparatus of claim 6, wherein the selector transfers the first divided test result to a second fail memory unit of the plurality of fail memory units while the second divided test result stored in a first fail memory unit of the plurality of fail memory units is analyzed.

8. The apparatus of claim 6, further comprising a data bus connecting the fail memory units to each other, wherein
the first or second divided test result stored in a first fail memory unit of the plurality of fail memory units can be transferred to a second fail memory unit of the plurality of fail memory units.

9. A memory test apparatus comprising:
a first storage medium comprising a first memory part and a second memory part which receive and temporarily retain first and second divided test results respectively, the first and second divided test results being divided portions of a test result of memory cells of a device under test in a plurality of divided portions based on data output from the device under test;
a first processor reading the first and second divided test results from the first and second memory parts and to compress the first and second divided test results into first and second compressed test results;
a second storage medium provided to the device under test, the second storage medium receiving the first and second compressed test results from the first processor and saving the first and second compressed test results; and
a second processor provided between the devices under test and the first storage medium, the second processor comparing the divided test results with a preset first fail pattern and transfer addresses of first fail bits corresponding to the preset first fail pattern included in the first divided test result to the first storage medium when the preset first fail pattern is included in a fail bit map of the first divided test result,
wherein the second storage medium, the first storage medium, and the first processor are provided to respectively correspond to a plurality of devices under test,
the first processor compresses the second divided test result and the addresses of the first fail bits transferred from the second processor to the first storage medium, and
the second storage medium stores therein the compressed second divided test result and the compressed addresses of the first fail bits.

10. The apparatus of claim 9, further comprising:
a plurality of fail memory units respectively comprising the first storage medium, the first processor, and the second storage medium, and
a selector provided between the devices under test and the fail memory units receiving the first and second divided test results and transferring the first and second divided test results selectively to any of the fail memory units of the plurality of fail memory units.

11. The apparatus of claim 10, wherein the selector transfers the first divided test result to a second fail memory unit of the plurality of fail memory units while the second divided test result stored in a first fail memory unit of the plurality of fail memory units is analyzed.

12. The apparatus of claim 10, further comprising a data bus connecting the fail memory units to each other, wherein
the first or second divided test result stored in a first fail memory unit of the plurality of fail memory units can be transferred to a second fail memory unit of the plurality of fail memory units.

* * * * *